United States Patent [19]

Dragoon

[11] Patent Number: 4,935,856
[45] Date of Patent: Jun. 19, 1990

[54] SURFACE MOUNTED LED PACKAGE

[75] Inventor: Daniel Dragoon, Manasquan, N.J.

[73] Assignee: Dialight Corporation, Manasquan, N.J.

[21] Appl. No.: 417,469

[22] Filed: Oct. 5, 1989

[51] Int. Cl.$^5$ .............................................. E21V 7/00
[52] U.S. Cl. .................................... 362/307; 362/800
[58] Field of Search ........................ 362/307, 362, 800

[56] References Cited

U.S. PATENT DOCUMENTS

| | | | |
|---|---|---|---|
| 4,471,415 | 9/1984 | Larson et al. | 362/800 |
| 4,555,749 | 11/1985 | Rifkin et al. | 362/800 X |
| 4,704,669 | 11/1987 | Brunner | 362/800 X |
| 4,727,648 | 3/1988 | Savage, Jr. | 362/800 X |

*Primary Examiner*—Allen M. Ostrager
*Attorney, Agent, or Firm*—Oblon, Spivak, McClelland, Maier & Neustadt

[57] ABSTRACT

The surface mounted LED package disclosed herein includes an LED having a first surface, a second surface opposite to the first surface, two electrical contacts on the first surface, and a light emitting portion in the second surface; a housing mounted on the LED and having a generally rectangular parallelepipedal shape, a first passageway extending from a first surface of the housing part way through the housing, the first passageway being sized, shaped, and positioned to receive the second surface of the LED such that the light emitting portion of the second surface faces into the first passageway, and a second passageway extending from a second surface of the housing to a third surface of the housing and communicating with the first passageway; and a lens received in the second passageway and having a first radiating surface located outside the housing and an internal reflecting surface located inside the housing above the light emitting portion of the LED in position to reflect light from the light emitting portion of the LED toward the radiating surface.

8 Claims, 1 Drawing Sheet

SURFACE MOUNTED LED PACKAGE

FIELD OF THE INVENTION

This invention relates generally to structures for mounting visual indicators on printed circuit boards. It relates particularly to structures for mounting light-emitting diodes ("LEDs") on printed circuit boards using surface mount technology.

CROSS-REFERENCE TO RELATED APPLICATION

This application is related to commonly assigned application Ser. No. 07/454,468, filed Dec. 21, 1989 concurrently herewith.

BACKGROUND OF THE INVENTION

Printed circuit boards using surface mount technology have several advantages over prior printed circuit boards. In surface mount circuit boards, through holes for mounting devices to the board are completely eliminated. Instead, circuitry is packed close together, and the space usually required for through holes is utilized more efficiently. Accordingly, the boards can be smaller though carrying the same amount of circuitry, or more circuitry can be carried by the same sized board. Furthermore, the components mounted on the circuit boards can be smaller than those used on conventional printed circuit boards.

However, surface mount technology creates certain problems. Since the printed conductors and components must be located closer together than with other printed circuit boards, greater accuracy in the location of components and conductors on the boards is required. Furthermore, since wave soldering usually is not used, radiant heating in an oven or the like usually is used to heat the components and their leads so as to cause the preapplied solder paste to melt and attach the components to the board. The more demanding requirements of surface mount technology place greater demands on the structures and techniques for mounting components, visual indicators, etc. on the circuit boards.

Often it is necessary to mount visual indicators such as LEDs on a printed circuit board with the light elevated above the surface of the board and/or with the LED near to one edge of the board. Each of these requirements creates special problems in the mounting of the LEDs.

The mounting of circuit components on surface mount boards often is accomplished simply by cutting the electrical lead conductors of the devices, bending the conductors to a proper shape, and then soldering them to the pads on to which the devices are to be mounted. This technique also has been used to mount LEDs on surface mount boards. However, the leads usually provided for LEDs tend to be too pliable and narrow to balance the LED on the circuit board until it is soldered. Furthermore, the conical dome shape of LEDs makes them incompatible with surface mount pick-and-place mechanisms.

Perhaps the greatest deficiency of the above mounting technique lies in the fact that conventional LEDs are not capable of withstanding the heat associated with solder reflow processes. Through-hole LEDs are constructed by embedding a lead frame in a castable epoxy. Such encapsulants are not structurally sound at solder reflow temperatures. The glass transition temperature for casting epoxies is far lower than the temperature of the soldering furnace. As the epoxy softens, the lead frame is allowed to move, causing the ultimate breakage of the wire bond. Manufacturers that have attempted to use conventional LEDs in surface mount processes have experienced unacceptable failure rates.

Conversely, LEDs designed for surface mounting are well suited for pick-and-place mechanisms, and they can successfully withstand solder temperatures. However, lacking a focusing lens, these miniature devices offer poor optical performance: low light intensity levels, light bleeding when several LEDs are mounted in close proximity, and the unavailability of right-angle viewable devices.

OBJECTS OF THE INVENTION

Accordingly, it is an object of the present invention to provide a structure for mounting visual indicators, particularly LEDs, on printed circuit boards, particularly surface mount boards, with strength, accuracy, and variability in positioning while providing optical enhancements.

It is a further object of the invention to provide optical enhancements that increase light intensity, focus light to reduce light bleeding, and permit right-angle viewing.

It is a still further object of the invention to provide such a structure in which a visual indicator can be mounted a substantial distance above the surface of the board and/or near one edge of the board so that it can be seen more easily and whenever required for any other reason.

It is a further object of the invention to provide such a structure with relatively broad conductive support surfaces for attachment to conductive pads on the boards with a high degree of accuracy and precision and with mechanical strength.

It is a still further object of the invention to provide such a structure which is well adapted for precise positioning on surface mount boards by use of automated positioning equipment.

It is another object of the invention to provide such a structure which is relatively compact and inexpensive to manufacture.

It is still a further object of the invention to provide such a structure which overcomes or ameliorates the drawbacks of the prior art discussed above.

SUMMARY OF THE INVENTION

With the foregoing in mind, a surface mounted LED package according to the invention comprises an LED having a first surface, a second surface opposite to the first surface, two electrical contacts on the first surface, and a light emitting portion in the second surface; a housing mounted on the LED and having a generally rectangular parallelepipedal shape, a first passageway extending from a first surface of the housing part way through the housing, the first passageway being sized, shaped, and positioned to receive the second surface of the LED such that the light emitting portion of the second surface faces into the first passageway, and a second passageway extending from a second surface of the housing to a third surface of the housing and communicating with the first passageway; and a lens received in the second passageway and having a first radiating surface located outside the housing and an internal reflecting surface located inside the housing above the light emitting portion of the LED in position to reflect light from the light emitting portion of the LED toward the radiating surface.

DETAILED DESCRIPTION OF THE PRESENTLY PREFERRED EMBODIMENT

Figure 1:
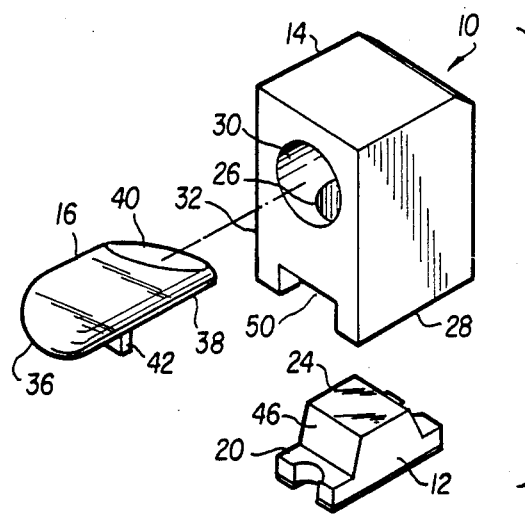
FIG. 1 is an exploded perspective view of a surface mounted LED package according to the invention.
Figure 2:
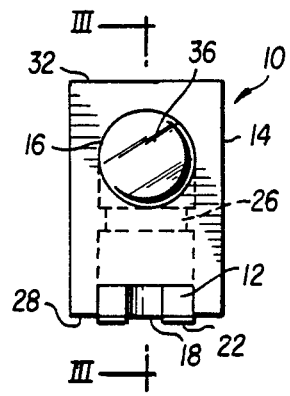
FIG. 2 is a front view of the surface mounted LED package shown in FIG. 1.
Figure 3:
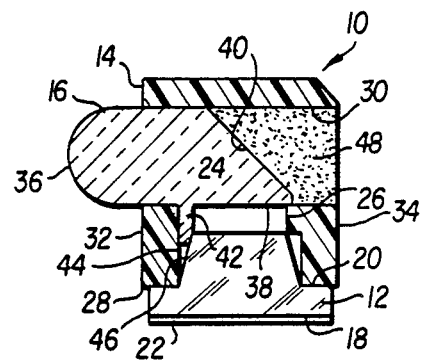
FIG. 3 is a cross sectional view on the line III—III in FIG. 2.

A surface mounted LED package 10 is shown in FIGS. 1-3. It comprises an LED 12, a housing 14, and a lens 16.

The LED 12 may be of any conventional kind—for instance, the kind sold under the designation BR1102W by Stanley. All that is important for present purposes is that it has a first surface 18, a second surface 20 opposite to the first surface 18, two electrical contacts 22 on the first surface 18, and a light emitting portion 24 in the second surface 20.

The housing 14 is mounted on the LED 12 by any appropriate means, such as by press fitting, by ultrasonic welding, or by gluing. The housing 14 has a generally rectangular parallelepipedal shape, thereby being well adapted for precise positioning on a circuit board by the use of automated positioning equipment. A first passageway 26 extends from a first surface 28 of the housing 14 part way through the housing 14. As best seen in FIG. 3, the first passageway 26 is sized, shaped, and positioned to receive the second surface 20 of the LED 12 such that the light emitting portion 24 of the second surface 20 faces into the first passageway 26. A second passageway 30 extends from a second surface 32 of the housing 14 to a third surface 34 of the housing 14 and communicates with the first passageway 26.

As best seen in FIG. 3, the lens 16 is received in the second passageway 30. It has a radiating surface 36 located outside the housing 14, a light collecting surface 38 located above the light emitting portion 24 of the LED 12, and an internal reflecting surface 40 located inside the housing 14 in position to reflect light from the light collecting surface 38 toward the radiating surface 36.

The light collecting surface 38 can be flat, concave to maximize light entry, or convex to focus light in conjunction with the internal reflecting surface 40 and the radiating surface 36. Other variations of the light collecting surface 38 and the internal reflecting surface 40 (such as stepped reflectors, fresnel surfaces, conic sections, or polynomial surfaces) are possible.

Additionally, the lens 16 is not limited to a generally round shape with a dome-shaped radiating surface 36. Lens barrel shapes following square, rectangular, or other polygons can be accommodated. Similarly, the radiating surface 36 can be designed as flat, fresnel, jewelled, or in other configurations depending on specific needs.

The lens 16 can be press'fit or glued into the second passageway 30. Alternatively, and as illustrated in FIG. 3, the lens 16 can be held in place by a flange 42 sandwiched between a wall 44 of the first passageway 26 and a stepped surface 46 of the LED 12. Lens retention can also be accomplished by a mass of plastic material 48 filling the portion of the second passageway 30 not filled by the lens 16. Preferably the mass of plastic material 48 is composed of an opaque reflecting material that supplements the function of the internal reflecting surface 40.

As best seen in FIG. 3, the first passageway 26 and the second passageway 30 are preferably perpendicular to each other, and the internal reflecting surface 40 is preferably disposed at 45° to both the first passageway 26 and the second passageway 30.

As best seen in FIG. 1, the housing 14 preferably has a slot 50 in its second (or front) surface 32 extending from its second surface 32 to its third (or rear) surface 34. As best seen in FIG. 2, the first passageway 26 preferably communicates with the slot 50, and the slot 50 is preferably located at the center of the sides of the second surface 32 and the rear surface 34 joining the first surface 28.

Figure 4:
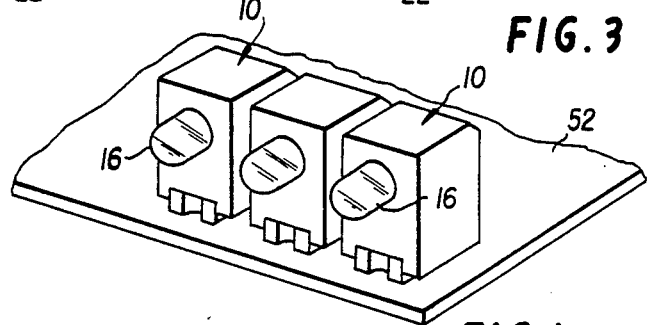
FIG. 4 is a perspective view of an array of three surface mounted LED packages of the type shown in FIG. 1 mounted on the edge of a printed circuit board.

FIG. 4 illustrates an array of three surface mounted LED packages 10 according to the invention mounted on a printed circuit board 44 near one of its edges.

Figure 5:
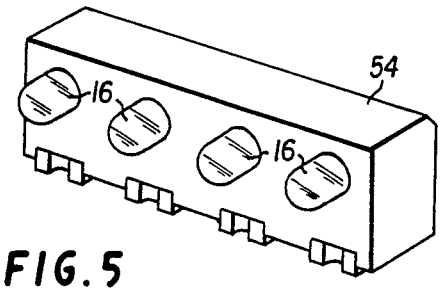
FIG. 5 is a perspective view of a single housing containing a plurality of LEDs.

FIG. 5 illustrates a single housing 54 containing a multiplicity of LEDs 12 and supplemental optics. A package containing multiple LEDs collecting into a single radiating surface is also possible.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A surface mounted LED package comprising:
 (a) an LED having:
  (i) a first surface;
  (ii) a second surface opposite to said first surface;
  (iii) two electrical contacts on said first surface; and
  (iv) a light emitting portion in said second surface;
 (b) a housing mounted on said LED, said housing having:
  (i) a generally rectangular parallelepipedal shape;
  (ii) a first passageway extending from a first surface of said housing part way through said housing, said first passageway being sized, shaped, and positioned to receive said second surface of said LED such that said light emitting portion of said second surface faces into said first passageway; and
  (iii) a second passageway extending from a second surface of said housing to a third surface of said housing and communicating with said first passageway; and
 (c) a lens received in said second passageway, said lens having:
  (i) a radiating surface located outside said housing and
  (ii) an internal reflecting surface located inside said housing above said light emitting portion of said LED in position to reflect light from said light emitting portion of said LED toward said radiating surface.

2. A surface mounted LED package as recited in claim 1 and further comprising an opaque reflecting material located in said second passageway adjacent said internal reflecting surface.

3. A surface mounted LED package as recited in claim 1 wherein:
(a) said first passageway and said second passageway are perpendicular to each other and
(b) said internal reflecting surface of said lens is disposed at 45° to both said first passageway and said second passageway.

4. A surface mounted LED package as recited in claim 1 wherein:
(a) said housing has a slot in its front surface extending from its second surface to its third surface and
(b) said first passageway communicates with said slot.

5. A surface mounted LED package as recited in claim 4 wherein said slot is located at the center of the edges of said second and third surfaces joining said first surface.

6. A surface mounted LED package as recited in claim 1 wherein said first passageway guides and reflects light from said LED to a light collecting surface of said lens.

7. A surface mounted LED package as recited in claim 6 wherein said second passageway has a cross section sized and shaped to accept said lens.

8. A surface mounted LED package as recited in claim 1 wherein said second passageway has a cross section sized and shaped to accept said lens.

* * * * *